(12) United States Patent
Shieh et al.

(10) Patent No.: US 6,992,607 B2
(45) Date of Patent: Jan. 31, 2006

(54) SPEECH SYNTHESIZER

(75) Inventors: Wuu-Trong Shieh, Hsinchu (TW);
Ying-Pin Ho, Hsinchu (TW)

(73) Assignee: Elan Microelectronics Corporation, Hsinchu (TW)

( * ) Notice: Subject to any disclaimer, the term of this patent is extended or adjusted under 35 U.S.C. 154(b) by 740 days.

(21) Appl. No.: 10/006,123

(22) Filed: Dec. 10, 2001

(65) Prior Publication Data
US 2002/0077824 A1    Jun. 20, 2002

(30) Foreign Application Priority Data
Dec. 20, 2000    (TW)  ................................ 89127460 A

(51) Int. Cl.
     *H03M 1/66*    (2006.01)

(52) U.S. Cl. ...................................... 341/144; 341/145

(58) Field of Classification Search ................. None
See application file for complete search history.

(56) References Cited

U.S. PATENT DOCUMENTS 5,631,647 A  *  5/1997  Huang ........................ 341/136

* cited by examiner

*Primary Examiner*—Peguy Jeanpierre
*Assistant Examiner*—Joseph Lauture
(74) *Attorney, Agent, or Firm*—Rosenberg, Klein & Lee

(57) ABSTRACT

To reduce power consumption and operation frequency, a speech synthesizer comprises a volume control unit to receive a control signal and generate a control bias, a signal transform unit to receive the control bias Vbias and a series of digital speech codes and under the control of the most significant bit of the digital speech codes to transform the other bits of the digital speech codes or its inverse into an analog signal, and a current output unit to receive the analog signal from the signal transform unit and output the analog signal from its two current output terminals under the control of the most significant bit of the digital speech codes. The speech synthesizer therefore needs no additional transistor to drive a speaker connected between the two current output terminals and save power.

12 Claims, 10 Drawing Sheets

SPEECH SYNTHESIZER

FIELD OF THE INVENTION

The present invention relates generally to a speech synthesizer, and more particularly, to a speech synthesizer operated in a low frequency with a push-pull drive.

BACKGROUND OF THE INVENTION

For consumer electronic products, it is an important function of digital sound effects, which is outputted on speakers typically by two methods, digital-to-analog converter (DAC) drive method and push-pull drive method such as pulse width modulation (PWM).

FIG. 1 shows the block diagram of a conventional DAC speech synthesizer 100 which includes three basic units, volume control unit 101, signal transform unit 102 and drive unit 103. The volume control unit 101 receives a control signal Vctrl and then generates a control bias Vbias, the signal transform unit 102 receives the control bias Vbias and PCM codes to transform into an analog speech signal Ivo, and the drive unit 103 receives the analog speech signal Ivo and amplifies it to be a current Ispeaker to drive a speaker 104. FIG. 2A is the waveform of a 7-bits sinusoidal PCM signal, FIG. 2B is the waveform of the analog speech signal Ivo after the PCM signal shown in FIG. 2A is processed by the signal transform unit 102 shown in FIG. 1, and the waveform of the output current signal Ispeaker after the analog speech signal Ivo is amplified by the drive unit 103 is shown in FIG. 2C. As shown in FIG. 2C, when a conventional DAC speech synthesizer transforms a digital speech signal back to an analog signal, the current signal Ispeaker has a zero point about 300 mA, which leads to a more power consumption as shown in the area with dashed lines in FIG. 2C. For applications of portable electronic products whose power supply is battery, such large power consumption should be avoided. Moreover, to prevent the transistor 105 within the drive unit 103 from being saturated and resulting in a speech distortion, a bypass resistor 106 is inserted therefor, which further results in speech distortion more seriously.

Shown in FIG. 3 is a push-pull output circuit diagram of a PWM speech synthesizer, which improves the power consumption and needs no additional transistors employed in the speech synthesizer. FIG. 4A is the waveform of a 7-bits sinusoidal PCM signal, FIG. 4B shows the modulated signals SPK1 and SPK2 respectively corresponding to the positive and negative half cycles of the PCM signal shown in FIG. 4A after processed by the push-pull speech synthesizer shown in FIG. 3, and the waveform of the output current signal Ispeaker for the speaker transformed from the PWM modulated signals SPK1 and SPK2 is shown in FIG. 4C.

To drive a PWM speech synthesizer, there is necessary to provide an operation frequency $$f = f_s \times 2^{n-1} \times m, \quad [\text{Eq-1}]$$

where fs is sampling frequency, n is bit numbers of PCM data, and m is output pulse number for each sample. $2^{n-1}$ in Eq-1 represents the resolution of the speech signal. When a desired resolution or output pulse number is increased, the operation frequency is also increased. If more than one sampling frequency are available for a synthesizer, the operation frequency has to be a common multiple of the sampling frequencies and is thus generally high.

SUMMARY OF THE INVENTION

To resolve the above problems, the present invention is therefore directed to a speech synthesizer with reduced power consumption and operation frequency.

According to the present invention, a speech synthesizer comprises a signal transform unit to receive and transform a series of digital speech codes to be an analog speech signal with the most significant bit (MSB) of each digital speech code to control the transformation of the digital speech codes, and a current output unit connected to the signal transform unit, which includes a first and second signal output terminals and receives the analog speech signal with the MSB of each digital speech code to control the current output direction of the current output unit.

BRIEF DESCRIPTION OF THE DRAWINGS

For a better understanding of the present invention, reference may be had to the following description of exemplary embodiments thereof, considered in conjunction with the accompanying drawings, in which.

DESCRIPTION OF PREFERRED EMBODIMENTS

Figure 1:
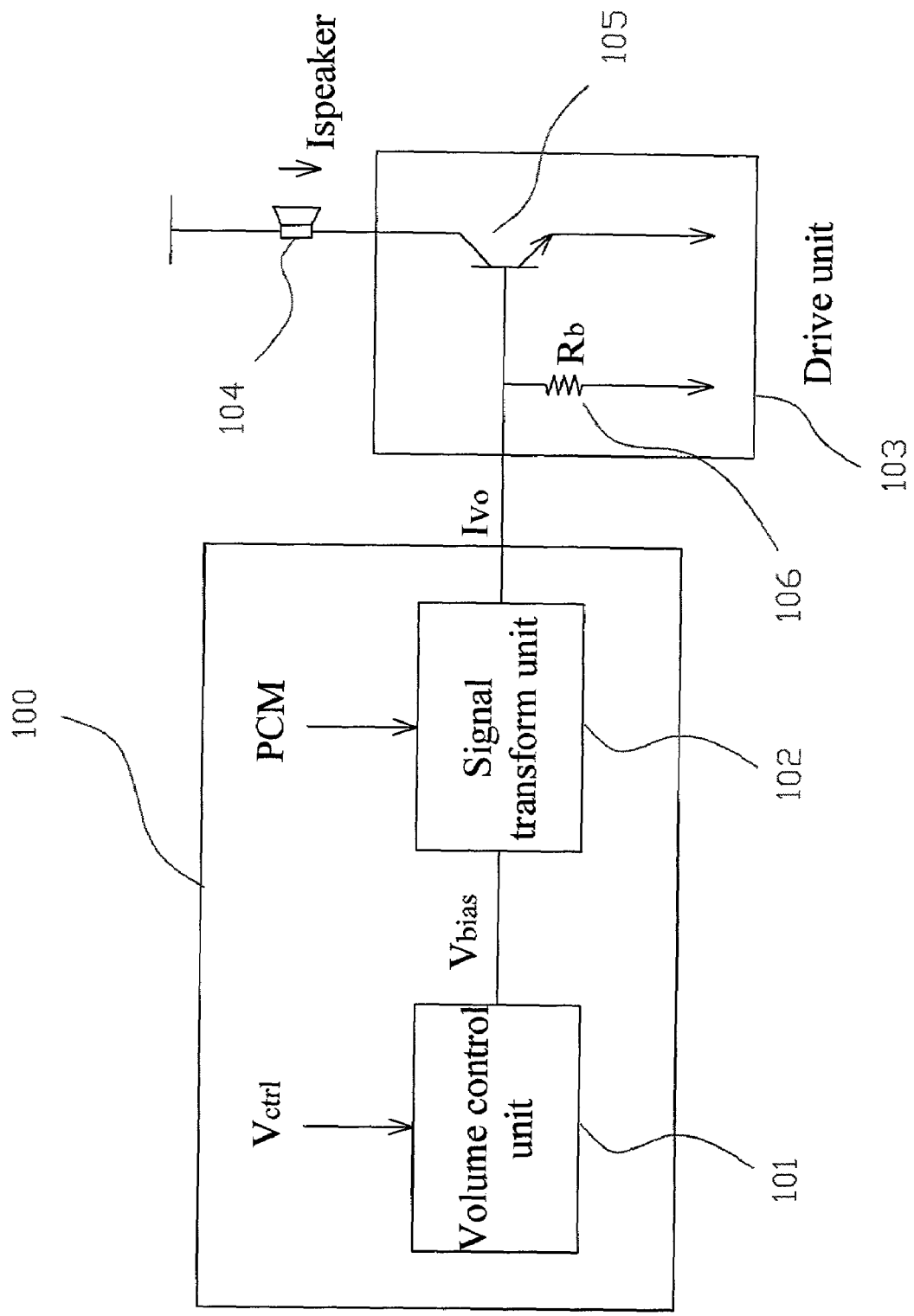
FIG. 1 shows the block diagram of a conventional DAC speech synthesizer.
Figures 2A, 2B, 2C:
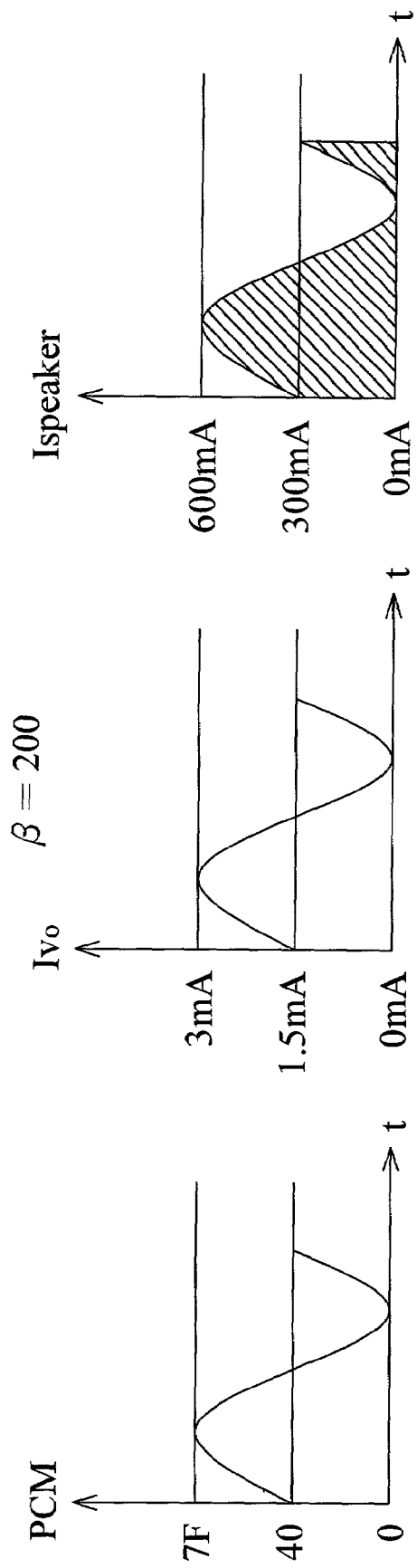
FIG. 2A is the waveform of a 7-bits sinusoidal PCM signal.
FIG. 2B is the waveform of the analog speech signal Ivo after the PCM signal shown in FIG. 2A is processed by the signal transform unit 102 shown is FIG. 1.
FIG. 2C is the waveform of the output current signal Ispeaker after the analog speech signal Ivo shown in FIG. 2B is amplified by the drive unit 103.
Figure 3:
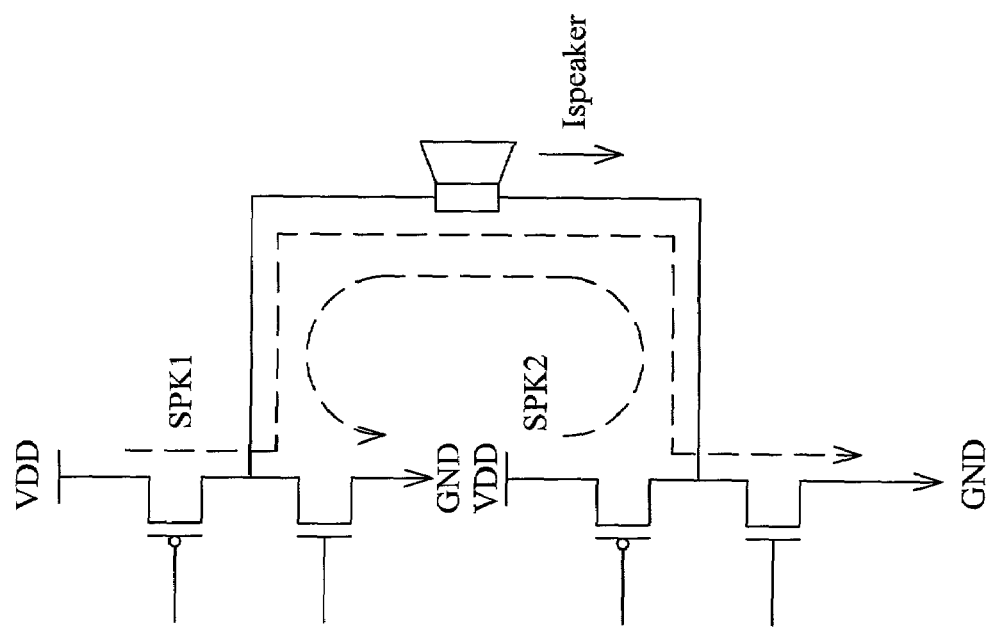
FIG. 3 is a push-pull output circuit diagram of a PWM speech synthesizer.
Figures 4A, 4B, 4C:
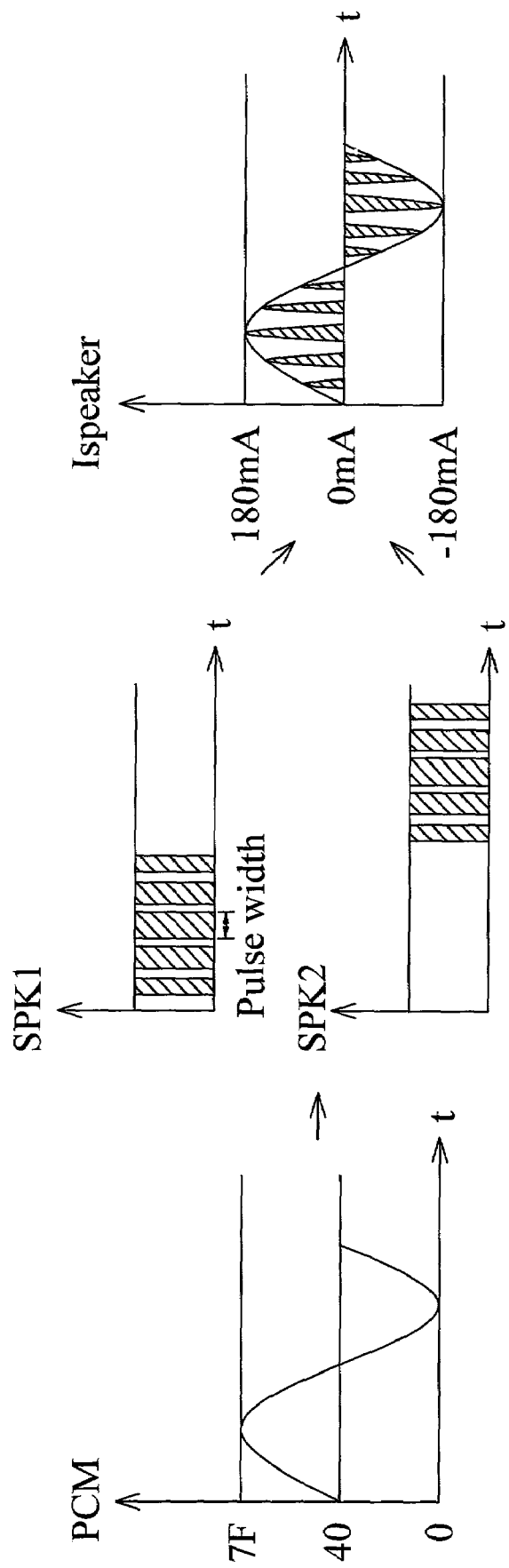
FIG. 4A is the waveform of a 7-bits sinusoidal PCM signal.
FIG. 4B is the modulated signals SPK1 and SPK2 respectively corresponding to the positive and negative half cycles of the PCM signal shown in FIG. 4A after processed by the push-pull speech synthesizer shown in FIG. 3.
FIG. 4C is the waveform of the output current signal Ispeaker for the speaker transformed from the PWM modulated signals SPK1 and SPK2.
Figure 5:
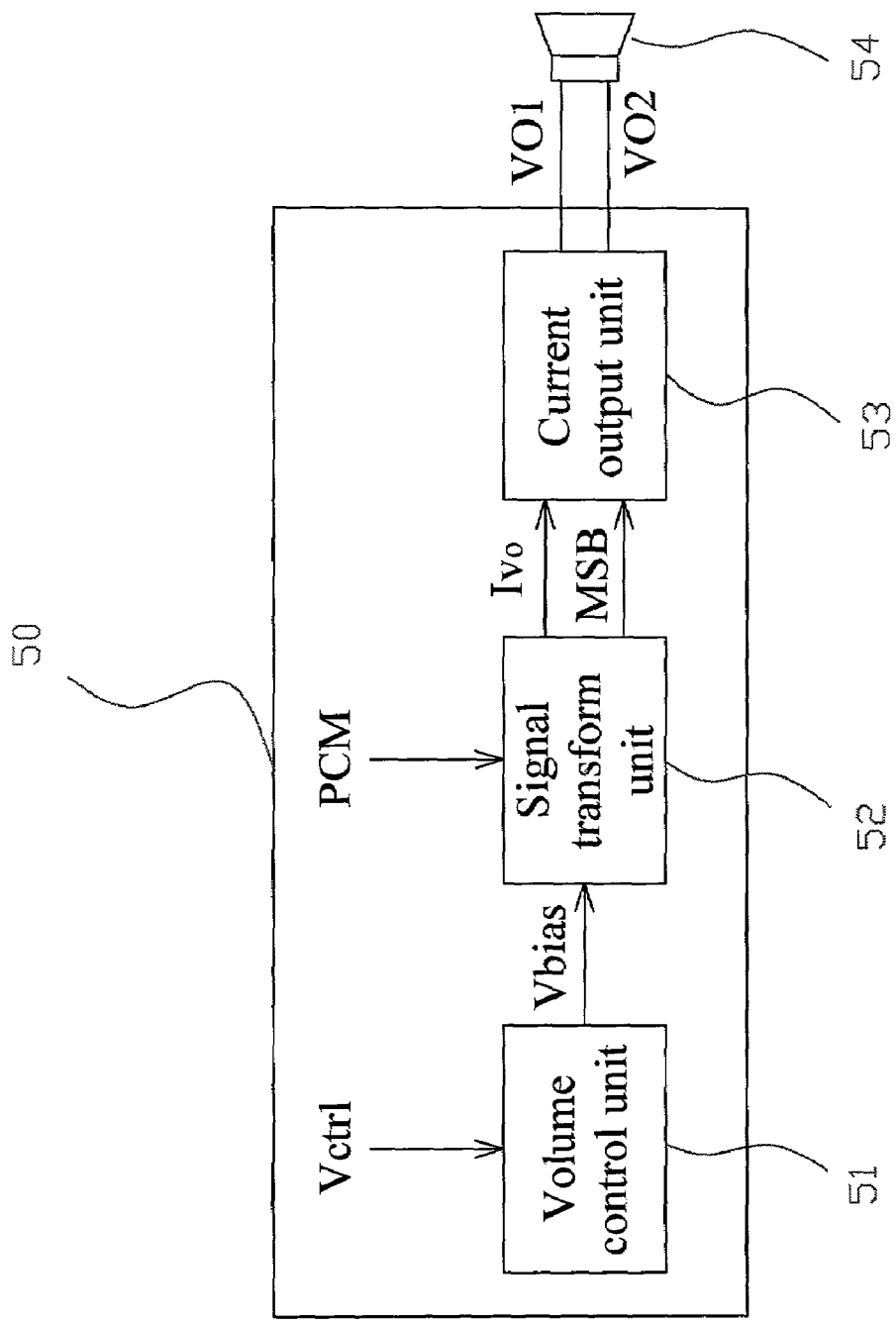
FIG. 5 is the block diagram of a preferred embodiment speech synthesizer according to the present invention.

FIG. 5 shows the block diagram of a preferred embodiment speech synthesizer according to the present invention. As shown in this figure, a speech synthesizer 50 comprises three basic units, volume control unit 51, signal transform unit 52 and current output unit 53, in which the volume control unit 51 receives a control signal Vctrl and generates a control bias Vbias transmitted to the signal transform unit 52 to adjust the volume with a function similar to that of the volume control unit 101 within the conventional DAC speech synthesizer 100.

Figure 6:
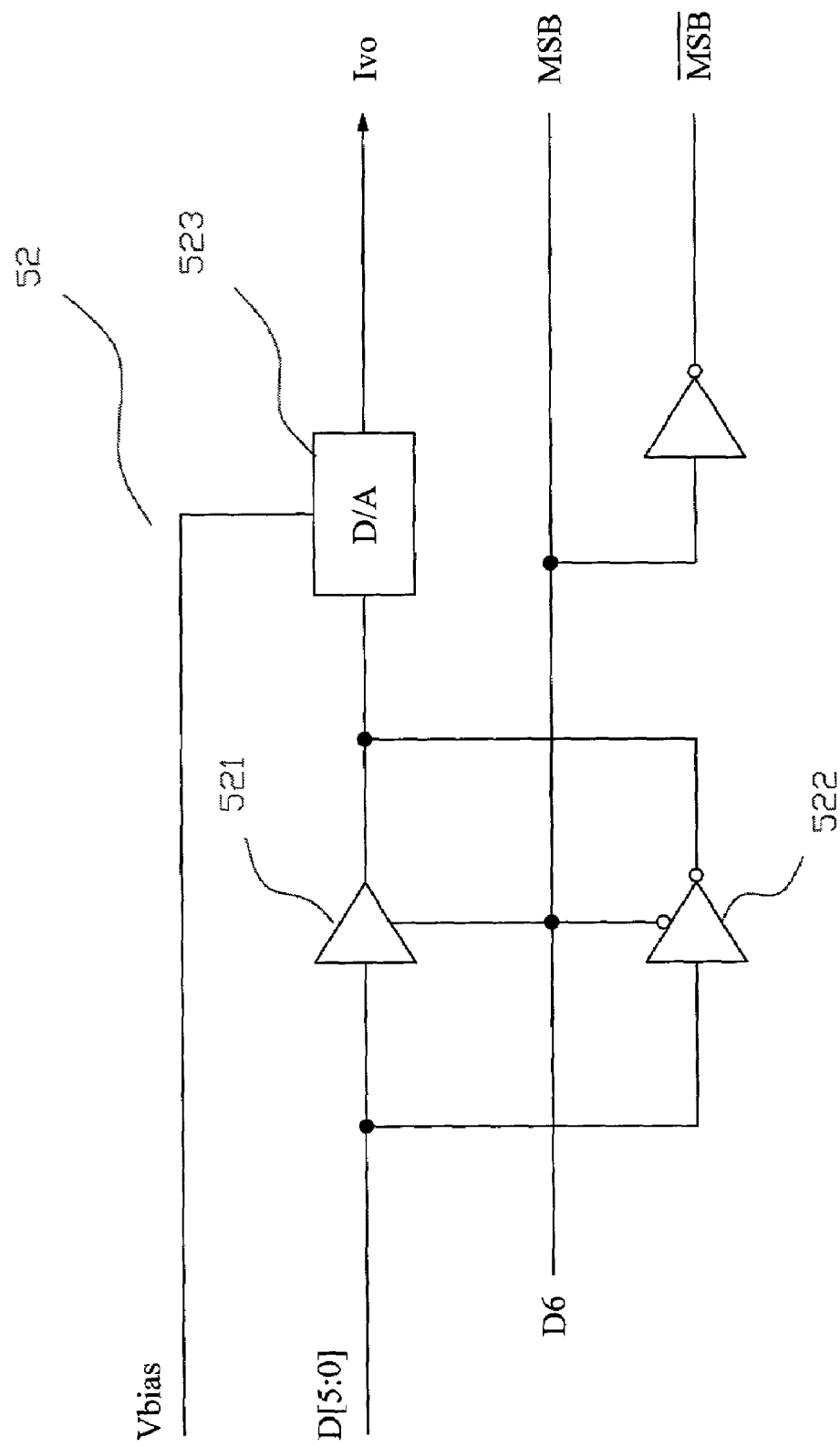
FIG. 6 is an implemented circuit diagram of the signal transform unit within the speech synthesizer shown in FIG. 5.
Figures 7A, 7B:
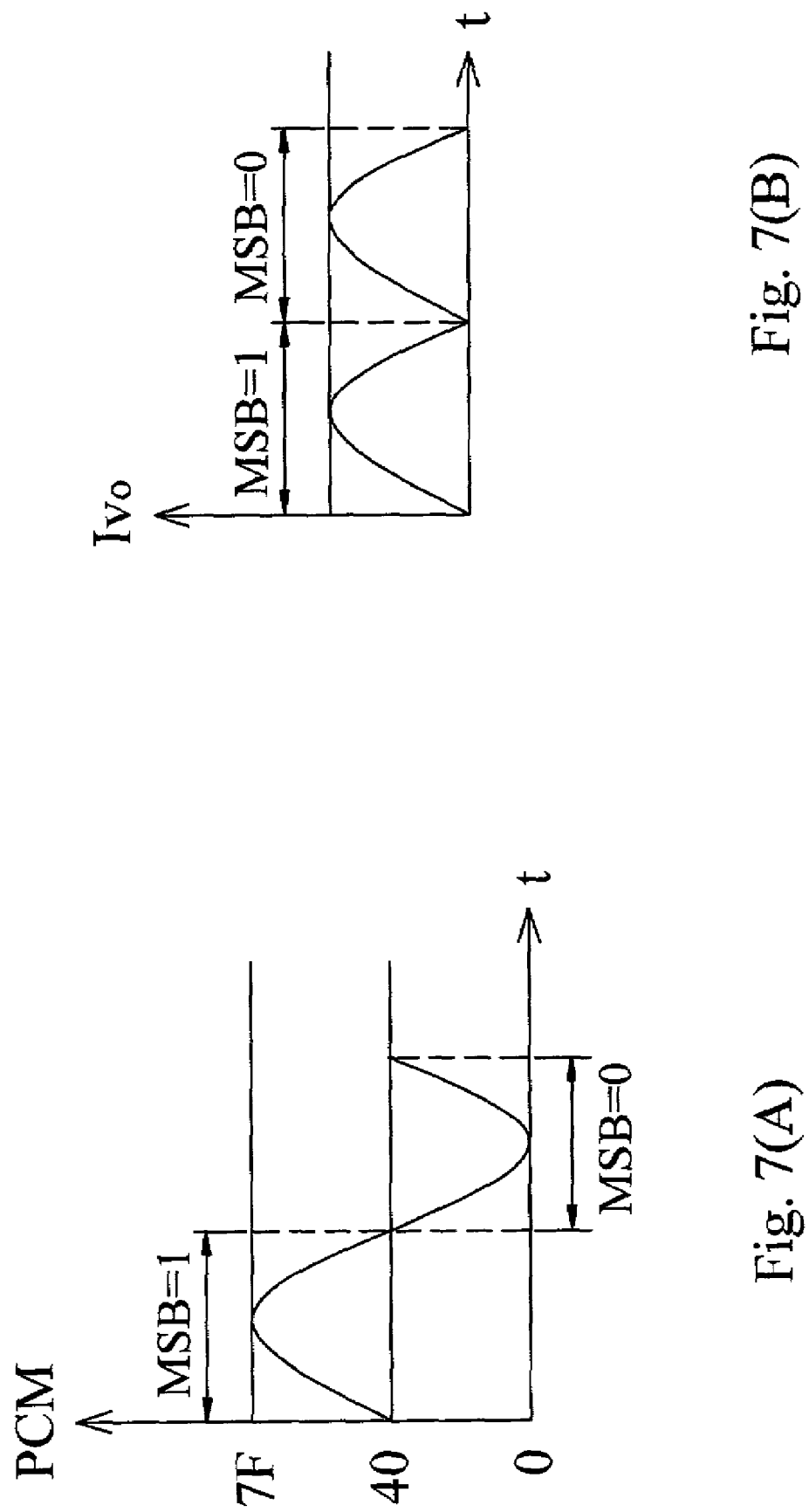
FIG. 7A is a 7-bits sinusoidal PCM digital speech signal.
FIG. 7B is the output signal from the signal transform unit after the PCM signal shown in FIG. 7A is processed by the speech synthesizer shown in FIG. 5.

FIG. 6 shows an implemented circuit diagram of the signal transform unit 52, which receives the control bias Vbias and a series of digital speech signal, D [0:6], to transforms into an analog speech signal Ivo. As shown in the figure, the signal transform unit 52 includes a switched buffer 521 and a switched inverter buffer 522 connected in parallel, and a DAC 523. The switched buffer 521 and inverter buffer 522 receive the lower bits data D [5:0] of the PCM digital speech signal under the control of the MSB D6 in a manner that the switched buffer 521 is enabled to transfer the lower bits data D [5:0] to the DAC 523 when MSB=1; and the switched inverter buffer 522 is enabled to transfer the inverse of the lower bits data D [5:0] to the DAC 523 when MSB=0. The DAC 523 transforms the lower bits data D [5:0] transmitted from the switched buffer 521 and inverter buffer 522 into the analog speech signal Ivo. As shown in FIG. 7A, a 7-bits sinusoidal PCM digital speech signal has a zero position of 40 H, and thus the MSBs of those upper and lower half cycles are 1 and 0 respectively. The PCM digital speech signal is therefore transformed by the signal transform unit 52 into the analog speech signal Ivo shown in FIG. 7B.

The controls of the current output unit 53 for different type connections are illustrated in FIG. 8. Based on the push-pull operation, the current output unit 53 outputs a current in different directions corresponding to positive and negative half cycles to directly drive a speaker. As shown in the figure, the current output unit 53 includes a first control switch 701, a second control switch 702, a first switched current source 703 and a second switched current source 704, all of them are under controlled by the MSB of the digital speech signal, and a first current output terminal V01 and a second current output terminal V02 to output the drive current to the connected speaker 54. There are two types for the output current of the current output unit 53. In detail, when MSB=1, the first control switch 701 and first switched current source 703 are conducted so as for the drive current to flow from the first current output terminal V01 to the second current output terminal V02 through the speaker 54, and the second control switch 702 and second switched current source 704 are conducted so as for the drive current to flow from the second current output terminal V02 to the first current output terminal V01 through the speaker 54 when MSB=0. This way the current output unit 53 generates a push-pull output current to drive the speaker 54.

Figure 8C:
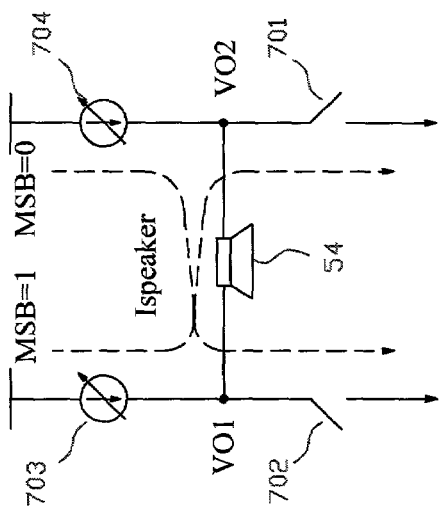
FIG. 8C is the third type connection of the current output unit and speaker for the speech synthesizer of the present invention.
Figure 8B:
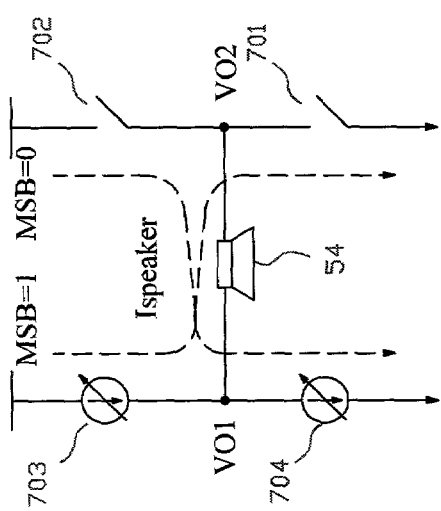
FIG. 8B is the second type connection of the current output unit and speaker for the speech synthesizer of the present invention.
Figure 8A:
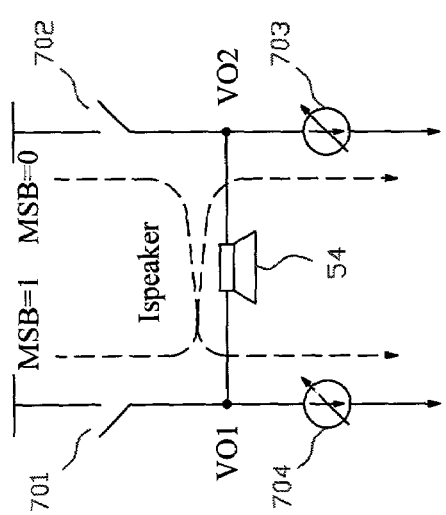
FIG. 8A is the first type connection of the current output unit and speaker for the speech synthesizer of the present invention.

The first type connection for the current output unit 53 is shown in FIG. 8A, in which the first control switch 701 is connected to a power supply VDD with one end and the second switched current source 704 with the other that is also the first current output terminal V01, and the other end of the second switched current source 704 is connected to a low voltage such as grounded. On the other hand, the second control switch 702 is connected to a power supply VDD with one end and the first switched current source 703 with the other that is also the second current output terminal V02, and the other end of the first switched current source 703 is connected to a low voltage such as grounded.

The second type connection for the current output unit 53 is shown in FIG. 8B, in which the first switched current source 703 is connected to a power supply VDD with one end and the second switched current source 704 with the other that is also the first current output terminal V01, and the other end of the second switched current source 704 is connected to a low voltage such as grounded. On the other hand, the second control switch 702 is connected to a power supply VDD with one end and the first control switch 701 with the other that is also the second current output terminal V02, and the other end of the first control switch 701 is connected to a low voltage such as grounded.

The third type connection for the current output unit 53 is shown in FIG. 8C, in which the first switched current source 703 is connected to a power supply VDD with one end and the second control switch 702 with the other that is also the first current output terminal V01, and the other end of the second control switch 702 is connected to a low voltage such as grounded. On the other hand, the second switched current source 704 is connected to a power supply VDD with one end and the first control switch 701 with the other that is also the second current output terminal V02, and the other end of the first control switch 701 is connected to a low voltage such as grounded.

Figure 9:
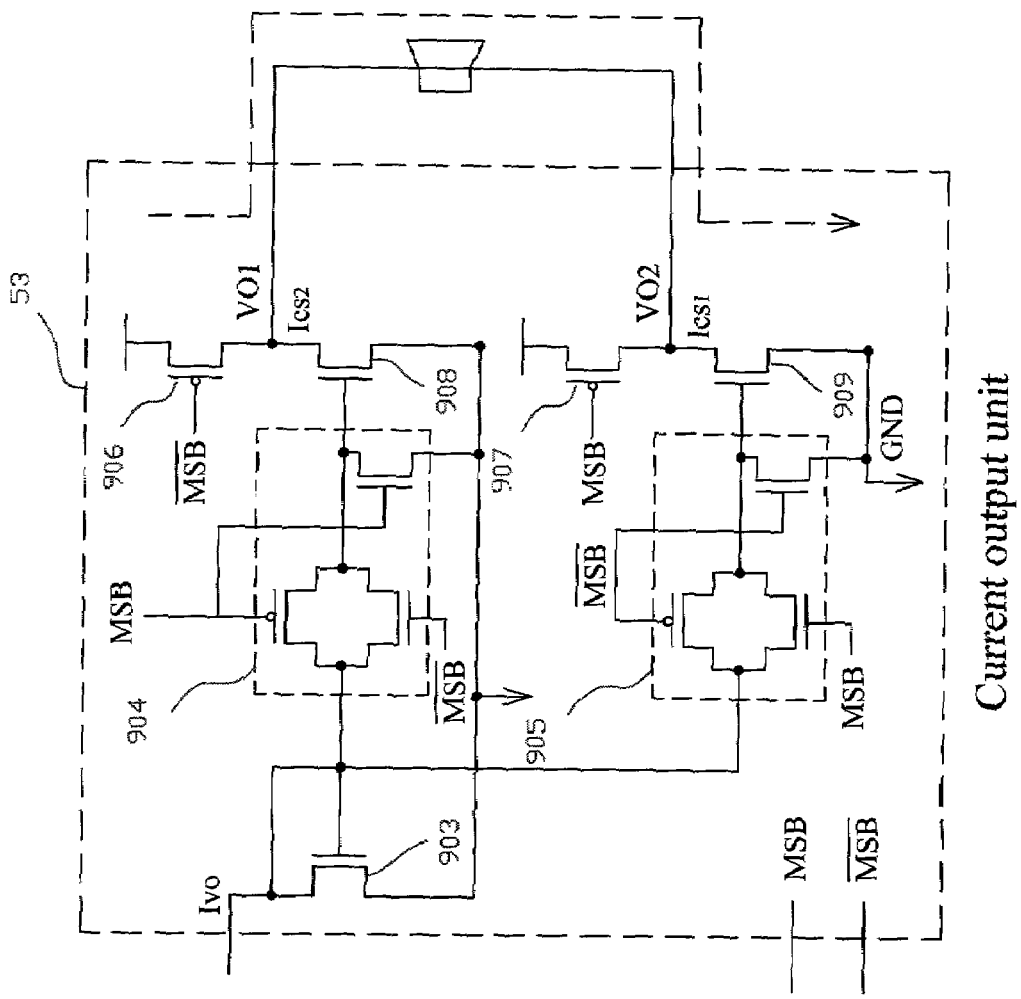
FIG. 9 is a detailed circuit for the current output unit shown in FIG. 8A.

A detailed circuit for the current output unit 53 shown in FIG. 8A is provided in FIG. 9, and the circuits for those shown in FIGS. 8B and 8C can be easily obtained in reference to the correspondence between FIG. 9 and FIG. 8A. The current output unit 53 in FIG. 9 includes a first transistor 906 serving as the first control switch 701, a second transistor 907 serving as the second control switch 702, a first variable current controlled switch 905 to control the first switched current source 703 and a second variable current controlled switch 904 to control the second switched current source 704. The current output unit 53 further includes a third transistor 903 and fourth transistor 909 to form a current mirror for the first switched current source 703 and a fifth transistor 908 in combination with the third transistor 903 to form another current mirror for the second switched current source 704.

Figure 10:
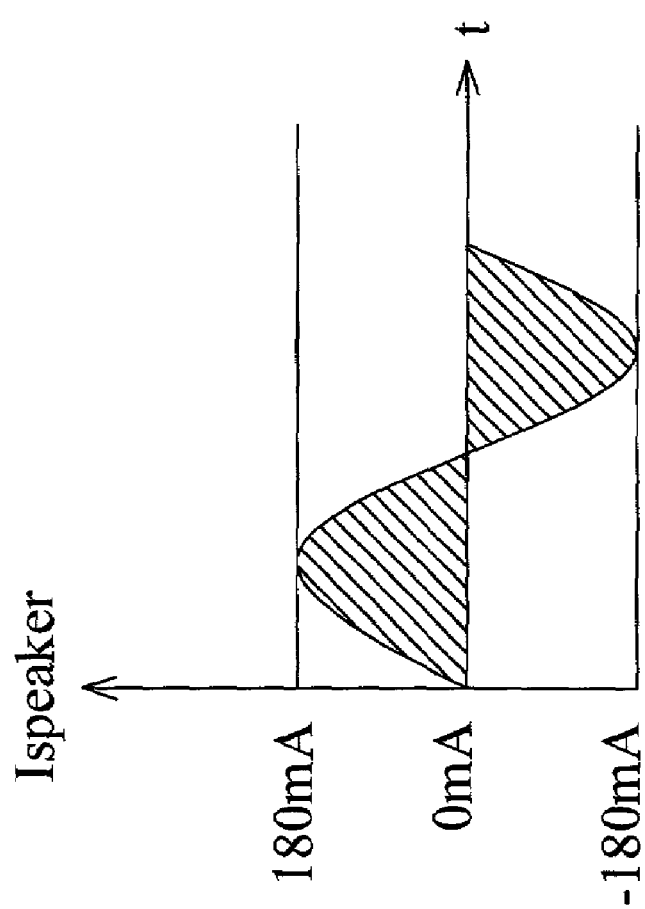
FIG. 10 is the waveform of the drive current generated by the current output unit shown in FIG. 9 from the analog speech signal shown in FIG. 7B.

For the circuit shown in FIG. 9, when the MSB of the digital speech signal is 1, the first transistor 906 and the first variable current controlled switch 905 are conducted so as for the drive current to flow through a current path that is formed from the first transistor 906 to the fourth transistor 909 through the first current output terminal V01, speakers 54 and second current output terminal V02 with its magnitude controlled by the Ivo and current mirror composed of the third and fourth transistors 903 and 909. On the contrary, when the MSB of the digital speech signal is 0, the second transistor 907 and the second variable current controlled switch 904 are conducted so as for the drive current to flow through another current path that is formed from the second transistor 907 to the fifth transistor 908 through the second current output terminal V02, speakers 54 and first current output terminal V01 with its magnitude controlled by the Ivo and current mirror composed of the third and fifth transistors 903 and 908. As a result, the current passing through the speaker 54 has a zero position of 0 mA as shown in FIG. 10, there is thus no additional DC current consumption induced.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A speech synthesizer comprising:
a signal transform unit for receiving and transforming a series of digital speech codes defining a waveform having positive and negative half cycles to an analog speech signal with its negative half cycles inverted to positive polarity relative to an intermediate reference for minimizing power consumption; and
a current output unit connected to said signal transform unit and including a first and second signal output terminals, for receiving said analog speech signal and outputting its positive and negative cycles currents respectively from said first and second output terminals.

2. A speech synthesizer according to claim 1 further comprising a volume control unit for receiving a control signal and generating a control bias.

3. A speech synthesizer according to claim 1 wherein said signal transform unit controls transformation of said digital speech codes with a most significant bit of each said digital speech code.

4. A speech synthesizer according to claim 1 wherein said current output unit comprising:
a first switched current source controlled by said most significant bit of said digital speech codes, with a first terminal connected to said first signal output and a second terminal connected to a high voltage;
a first switch controlled by said most significant bit of said digital speech codes, for outputting said analog speech signal and with a first terminal connected to said second signal output and a second terminal connected to a low voltage;
a second switch controlled by an inverse of said most significant bit of said digital speech codes, with a first terminal connected to said second signal output and a second terminal connected to said high voltage; and
a second switched current source controlled by said most significant bit of said digital speech codes, for outputting said analog speech signal and with a first terminal connected to said first signal output and a second terminal connected to said low voltage.

5. A speech synthesizer according to claim 4 wherein said first and second switches are transistors.

6. A speech synthesizer according to claim 1 wherein said current output unit comprising:
a first switched current source controlled by said most significant bit of said digital speech codes, with a first terminal connected to said first signal output and a second terminal connected to a high voltage;
a second switched current source controlled by said most significant bit of said digital speech codes, with a first terminal connected to said second signal output and a second terminal connected to said high voltage;
a first switch controlled by said most significant bit of said digital speech codes, for outputting said analog speech signal and with a first terminal connected to said second signal output and a second terminal connected to a low voltage; and
a second switch controlled by said most significant bit of said digital speech codes, for outputting said analog speech signal and with a first terminal connected to said first signal output and a second terminal connected to said low voltage.

7. A speech synthesizer according to claim 6 wherein said first and second switches are transistors.

8. A speech synthesizer comprising:
a signal transform unit for receiving and transforming a series of digital speech codes to be an analog speech signal with its negative half cycles inverted; and
a current output unit connected to said signal transform unit and including first and second signal output terminals, for receiving said analog speech signal and outputting its positive and negative cycles currents respectively from said first and second output terminals;
said signal transform unit comprising:
a switched buffer controlled by said most significant bit of said digital speech codes for receiving and outputting other bits of said digital speech codes;
a switched inverter buffer controlled by an inverse of said most significant bit of said digital speech codes for receiving and outputting other bits of said digital speech codes; and
a digital-to-analog converter connected to said switched buffer and inverter buffer for transforming into said analog speech signal.

9. A speech synthesizer comprising:
a signal transform unit for receiving and transforming a series of digital speech codes to be an analog speech signal with its negative half cycles inverted; and
a current output unit connected to said signal transform unit and including first and second signal output terminals, for receiving said analog speech signal and outputting its positive and negative cycles currents respectively from said first and second output terminals;
said current output unit comprising:
a first switch controlled by said most significant bit of said digital speech codes, with a first terminal connected to said first signal output and a second terminal connected to a high voltage;
a second switch controlled by an inverse of said most significant bit of said digital speech codes, with a first terminal connected to said second signal output and a second terminal connected to said high voltage;
a first switched current source controlled by said most significant bit of said digital speech codes, for outputting said analog speech signal and with a first terminal connected to said second signal output and a second terminal connected to a low voltage; and
a second switched current source controlled by said most significant bit of said digital speech codes, for outputting said analog speech signal and with a first terminal connected to said first signal output and a second terminal connected to said low voltage.

10. A speech synthesizer according to claim 9 wherein said first and second switches are transistors.

11. A speech synthesizer according to claim 9 wherein said first switched current source comprising:
a first transistor with a drain connected to an output of said signal transform unit, a source connected with said low voltage, and a gate connected to its drain;
a second transistor with a gate, a drain connected to said first signal output terminal and a source connected to said low voltage; and
a first variable current controlled switch controlled by said most significant bit of said digital speech codes, with a first terminal connected to said gate of said first transistor and a second terminal connected to said gate of said second transistor for forming a current mirror composed of said first and second transistors when said first variable current controlled switch is enabled.

12. A speech synthesizer according to claim 11 said second switched current source comprising:

a third transistor with a gate, a drain connected to said first signal output terminal and a source connected to said low voltage; and a second variable current controlled switch controlled by said most significant bit of said digital speech codes, with a first terminal connected to said gate of said first transistor and a second terminal connected to said gate of said third transistor for forming an another current mirror composed of said first and third transistors when said second variable current controlled switch is enabled.

* * * * *